United States Patent [19]

Schneider, Jr. et al.

[11] Patent Number: 5,557,627
[45] Date of Patent: Sep. 17, 1996

[54] VISIBLE-WAVELENGTH SEMICONDUCTOR LASERS AND ARRAYS

[75] Inventors: Richard P. Schneider, Jr.; Mary H. Crawford, both of Albuquerque, N.M.

[73] Assignee: Sandia Corporation, Albuquerque, N.M.

[21] Appl. No.: 444,462

[22] Filed: May 19, 1995

[51] Int. Cl.$^6$ .................................................. H01S 3/19
[52] U.S. Cl. ............................ 372/46; 372/45; 372/50; 372/96
[58] Field of Search .......................... 372/45, 46, 96, 372/50; 257/191

[56] References Cited

U.S. PATENT DOCUMENTS

| | | | |
|---|---|---|---|
| 5,034,958 | 7/1991 | Kwon | 372/45 |
| 5,231,298 | 7/1993 | Daly | 257/191 |
| 5,258,990 | 11/1993 | Olbright | 372/46 |
| 5,325,386 | 6/1994 | Jewell | 372/50 |
| 5,351,256 | 9/1994 | Schneider | 372/45 |
| 5,459,746 | 10/1995 | Itaya et al. | 372/96 |

OTHER PUBLICATIONS

M. K. Hibbs–Brenner, R. P. Schneider, Jr., R. A. Morgan, R. A. Walterson, J. A. Lehman, E. L. Kalweit, J. A. Lott, K. L. Lear, K. D. Choquette, and H. Juergensen, "Metalorganic Vapor–Phase Epitaxial Growth of Red and Infrared Vertical–Cavity Surface–Emitting Laser Diodes," *Microelectronics Journal*, vol. 25, pp. 747–755, 1994. (No month).

R. P. Schneider, Jr., J. A. Lott, K. L. Lear, K. D. Choquette, M. H. Crawford, S. P. Kilcoyne, and J. J. Figiel, "Metalorganic Vapor Phase Epitaxial Growth of Red and Infrared Vertical–Cavity Surface–Emitting Laser Diodes," *Journal of Crystal Growth*, vol. 145, pp. 838–845, 1994. (No month).

J. A. Lott, R. P. Schneider, Jr., K. J. Malloy, S. P. Kilcoyne, and K. D. Choquette, "Partial Top Dielectric Stack Distributed Bragg Reflectors for Red Vertical Cavity Surface Emitting Laser Arrays," *IEEE Photonics Technology Letters*, vol. 16, pp. 1397–1399, Dec. 1994.

M. H. Crawford, R. P. Schneider, Jr., K. D. Choquette, K. L. Lear, S. P. Kilcoyne, and J. J. Figiel, "Efficiency AlGaInP-–Based 660–680 nm Vertical–Cavity Surface Emitting Lasers," *Electronics Letters*, vol. 31, pp. 196–198, 2 Feb. 1995.

*Primary Examiner*—James W. Davie
*Attorney, Agent, or Firm*—John P. Hohimer; Gregory A. Cone

[57] ABSTRACT

A visible semiconductor laser. The visible semiconductor laser includes an InAlGaP active region surrounded by one or more AlGaAs layers on each side, with carbon as the sole p-type dopant. Embodiments of the invention are provided as vertical-cavity surface-emitting lasers (VCSELs) and as edge-emitting lasers (EELs). One or more transition layers comprised of a substantially indium-free semiconductor alloy such as AlAsP, AlGaAsP, or the like may be provided between the InAlGaP active region and the AlGaAS DBR mirrors or confinement layers to improve carrier injection and device efficiency by reducing any band offsets. Visible VCSEL devices fabricated according to the invention with a one-wavelength-thick ($1\lambda$) optical cavity operate continuous-wave (cw) with lasing output powers up to 8 mW, and a peak power conversion efficiency of up to 11%.

54 Claims, 5 Drawing Sheets

VISIBLE-WAVELENGTH SEMICONDUCTOR LASERS AND ARRAYS

This invention was made with Government support under Contract No. DE-AC04-94AL85000 awarded by the U.S. Department of Energy. The Government has certain rights in the invention.

FIELD OF THE INVENTION

The present invention relates to semiconductor lasers that emit light at visible wavelengths, and more particularly to vertical-cavity surface-emitting lasers, edge-emitting lasers, and laser arrays that are electrically injected and emit lasing radiation at wavelengths in the visible region of the spectrum.

BACKGROUND OF THE INVENTION

Semiconductor lasers such as vertical-cavity surface-emitting lasers (VCSELs) and edge-emitting lasers (EELs) that emit at visible wavelengths in the range of about 400 to 700 nm are of particular interest for applications such as optical scanning, image display, laser printing and xerography, optical data storage and readout, and plastic-fiber-based optical communications. These lasers may also be integrated with other electronic and photonic devices such as transistors and photodetectors for applications such as optical interconnects and the like. Of particular interest are VCSELs that emit laser radiation in a direction perpendicular to the plane of a semiconductor p-n junction formed within an optical cavity thereof since these devices emit a low-divergence output beam.

Olbright et al U.S. Pat. No. 5,258,990 discloses a visible VCSEL having undoped InAlGaP spacer layers disposed between the active region and distributed Bragg reflector (DBR) mirrors. The use of undoped InAlGaP spacer layers is disadvantageous due to the relatively high electrical resistance resulting from not doping the InAlGaP spacer layers. Furthermore the use of InAlGaP as a material for the spacer layers is disadvantageous due to the relatively high thermal resistance of InAlGaP.

Schneider et al U.S. Pat. No. 5,351,256 which is incorporated herein by reference discloses a visible VCSEL that is an improvement over the patent of Olbright et al and provides the first demonstration of an electrically-injected visible VCSEL. The advance of Schneider et al was to use InAlP optical-phase-matching spacer layers on either side of the active region to improve carrier confinement within the active region, and to reduce electron leakage therefrom. Although this improvement allowed electrically-injected pulsed lasing operation at a duty cycle of up to 40%, further improvements are needed for lasing in a continuous-wave (cw) mode.

A disadvantage of the visible VCSEL design of Schneider et al is the preference for relatively thick InAlP spacer layers (from $1\lambda$ to $3\lambda$ or more). Such thick InAlP spacer layers increase an optical loss within an optical cavity of the device due to increased free carrier absorption and impurity scattering therein.

Another disadvantage of the Schneider et al VCSEL design is the use of a relatively thick active region ($2\lambda$) which reduces the carrier injection efficiency, increases the optical loss of the optical cavity, and produces excessive device heating within the optical cavity due to the poor thermal conductivity of InAlGaP. This excessive device heating, which is indicated by lasing in an n=2 transition, limited operation of the VCSEL to a pulsed mode; whereas cw operation is preferred for many visible VCSEL applications.

A third disadvantage of the Schneider et al device is the use of magnesium (Mg) as a dopant for the p-type InAlP spacer layer. Mg may diffuse and exhibit erratic transport behavior during growth by metal-organic chemical vapor deposition (MOCVD) and may accumulate near the heterointerface between the p-type InAlP spacer layer and adjacent DBR mirror.

Yet another disadvantage of the Schneider et al patent is that growth of the InAlP spacer layers immediately adjacent to the AlAs/AlGaAs DBR mirrors is made difficult by requiring an abrupt and complete switch-on of a P source in the MOCVD growth during epitaxial growth at a high temperature of about 750°–775° C. And for growth of an InAlGaP active region another abrupt and complete switch-on of an As source must be performed. Each switch-on must be done very quickly, and is disadvantageous from a manufacturing standpoint due to the possibility of producing uncertain heterointerface characteristics between the DBR mirrors and the spacer layers.

An advantage of the visible semiconductor laser according to the present invention is that carbon may be used exclusively as a p-type dopant, thereby improving the dopant precision and stability against thermal diffusion during epitaxial growth and subsequent device processing.

Another advantage according to some embodiments of the visible semiconductor laser of the present invention is that one or more relatively thin ($\leq 1\lambda$) transition layers may be provided to reduce band offsets between an InAlGaP active region and surrounding AlGaAs layers.

A further advantage of embodiments of the present invention having one or more transition layers is that the transition layers may be formed of a substantially indium-free semiconductor alloy such as AlAsP, AlGaAsP, or the like so that the transition layers may be doped with carbon for forming a semiconductor laser having carbon as the sole p-type dopant.

Yet another advantage of embodiments of the present invention having one or more transition layers is that the transition layers may have a nearly-continuous composition grading without the need for any abrupt switch-on of As and P sources, thereby improving epitaxial growth and minimizing interface uncertainties.

Still another advantage of embodiments of the present invention having one or more transition layers is that the transition layers may provide for an increased thermal conductivity and reduced heating within the visible semiconductor laser by reducing a thickness of epitaxial layers in the device and/or by allowing the use of $Al_xGa_{1-x}As$ materials surrounding the InAlGaP active region with a thermal conductivity higher than InAlGaP or InAlP.

These and other advantages of the visible semiconductor lasers of the present invention will become evident to those skilled in the art.

SUMMARY OF THE INVENTION

Accordingly, it is a primary object of the present invention to provide a visible semiconductor laser in which carbon is employed as a sole or exclusive p-type dopant, thereby improving manufacturability and reliability of the laser.

Another object of the present invention is to provide a visible semiconductor laser which operates in a continuous-wave mode with an improved efficiency and lasing output power.

A further object of the present invention is to provide in some embodiments of the invention a visible semiconductor laser in which an operating voltage is reduced by providing one or more transition layers between the InAlGaP active region and surrounding AlGaAs layers to reduce band offsets therebetween.

Another object of the present invention is to provide in some embodiments of the invention a visible semiconductor laser having one or more transition layers between the InAlGaP active region and surrounding AlGaAs layers to improve carrier confinement in the active region and to reduce carrier leakage therefrom.

A further object of the present invention is to provide a visible semiconductor laser that may be epitaxially grown while avoiding any abrupt switch-on of As and P sources.

Yet another object of the present invention is to provide a semiconductor laser device structure that may be adapted for the formation of either visible VCSELs or visible EELs by a slight modification of an epitaxial growth process wherein $Al_xGa_{1-x}As$ DBR mirrors are grown to form VCSEL devices, and $Al_xGa_{1-x}As$ confinement layers are grown to form EEL devices.

Still another object of the present invention is to provide a visible VCSEL having an improved efficiency and cw output power by reducing an optical loss within the optical cavity by reducing a thickness thereof.

Additional objects, advantages, and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, a semiconductor laser for emitting at a visible wavelength in the range of about 400–700 nanometers comprises a III–V compound semiconductor substrate; at least one first-grown AlGaAs semiconductor layer formed above the substrate and having a first conductivity type; an active region comprised of InAlGaP formed above the first-grown AlGaAs layer and including at least one quantum-well layer; at least one last-grown AlGaAs semiconductor layer formed above the active region and having a second conductivity type opposite the first conductivity type, one of the conductivity types being defined as p-type by carbon, and the other conductivity type being defined as n-type to form a semiconductor junction about the active region; and electrodes above and below the semiconductor junction for electrically activating the laser.

According to a first embodiment of the present invention a visible vertical-cavity surface-emitting laser (VCSEL) is provided wherein a first AlGaAs distributed Bragg reflector (DBR) mirror is defined by a plurality of the first-grown AlGaAs semiconductor layers and a second AlGaAs distributed Bragg reflector (DBR) mirror is defined by a plurality of the last-grown AlGaAs semiconductor layers, with adjacent AlGaAs layers in each DBR mirror having different semiconductor alloy compositions. An optical cavity in the VCSEL is formed between the first and second DBR mirrors and includes the active region; and the optical cavity may further include a transition layer on one or both sides of the active region between the active region and the DBR mirrors to reduce band offsets within the VCSEL device.

According to a second embodiment of the present invention, the semiconductor laser may be formed as a visible edge-emitting laser (EEL) with the first-grown and last-grown AlGaAs layers being AlGaAs confinement layers (e.g. by substituting AlGaAs confinement layers for the AlGaAs DBR mirrors of the VCSEL device during epitaxial growth of the device). A transition layer may be provided on one or both sides of the active region (1.e.between the active region and the confinement layers) to reduce band offsets within the EEL device.

Other objects, advantages and novel features of the invention will become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
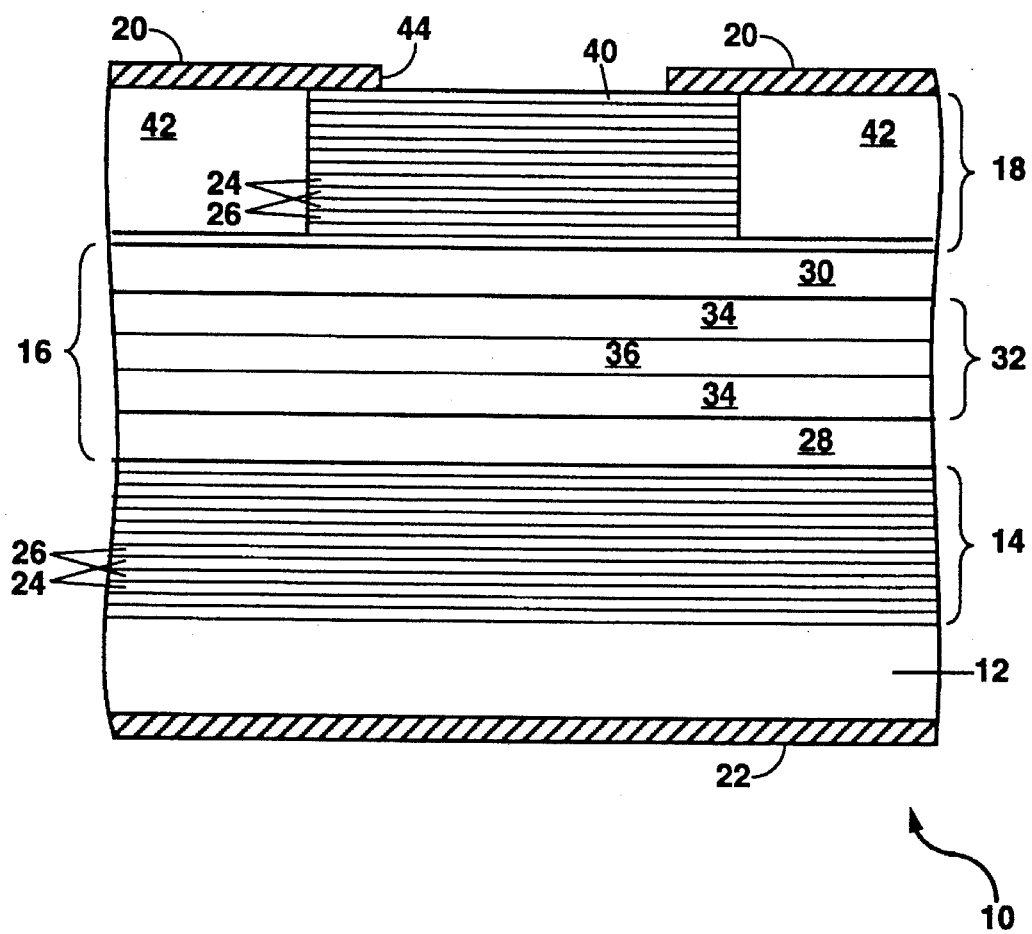
FIG. 1 shows a schematic diagram of an example of a visible VCSEL according to the first embodiment of the present invention.

Referring to FIG. 1, there is shown a schematic diagram of an example of a visible VCSEL formed according to a first embodiment of the present invention. The visible VCSEL semiconductor laser 10 comprises a III–V compound semiconductor substrate 12 upon which a first AlGaAs distributed Bragg reflector (DBR) mirror 14 being of a first conductivity type is formed. An optical cavity 16 is formed above the first DBR mirror 14 and includes an active region 32 with a semiconductor p-n or p-i-n junction formed thereabout. A second DBR mirror 18 is formed above the optical cavity and active region, and is of a second conductivity type opposite the first conductivity type (one of the conductivity types being defined as p-type by carbon, and the other conductivity type being defined as n-type to form at least in part the semiconductor junction about the active region). Upper and lower electrodes, 20 and 22 respectively, are provided above and below the semiconductor junction for electrically activating the laser to emit light at a visible wavelength within the range of about 400 to 700 nm.

In FIG. 1, the compound semiconductor substrate 12 (i.e. a semiconductor wafer) may be GaAs, or the like; and may be either semi-insulating or doped (e.g. n-type with Si at about $10^{18}$ cm$^{-3}$). The substrate 12 as defined herein may include one or more buffer layers epitaxially grown thereon for smoothing or conditioning an upper surface of the substrate prior to growth of the first DBR mirror 14. Preferable substrates 12 for the formation of the visible semiconductor lasers 10 are n$^+$-doped GaAs with either a (311)A orientation, or with an orientation about 6° off (100) towards <111>A.

A plurality of semiconductor layers are epitaxially grown on the substrate 12 by metal-organic chemical vapor deposition (MOCVD), molecular beam epitaxy (MBE), or the like for forming the VCSEL device 10. A preferred method for epitaxial growth of visible semiconductor lasers 10 is MOCVD in a conventional low-pressure, horizontal-tube reactor at a growth temperature in the range 600°–800° C. The metal-organic sources may include triethyl gallium (TEGa), trimethyl gallium (TMGa), trimethyl indium (TMIn), trimethyl aluminum (TMAl), arsine, and phosphine.

Silicon (Si) obtained, for example, from disilane (Si$_2$H$_6$) is preferred for use as an n-type dopant, although other n-type dopants such as tin (Sn), selenium (Se), tellurium (Te), and sulphur (S); and p-type dopants such as carbon (C), magnesium (Mg) and zinc (Zn) may be used for practice of the present invention.

Carbon (C) obtained, for example, from carbon tetrachloride (CCl$_4$) is preferred as a p-type dopant to provide a stable dopant profile with a very low diffusivity. To the best of our knowledge, visible semiconductor lasers (i.e. VCSELs and EELs) formed according to the present invention represent the first lasers having an InAlGaP active region surrounded by AlGaAs layers that have used carbon as the sole or exclusive p-type dopant. Prior-art visible semiconductor lasers having an InAlGaP active region have used one of the less-stable p-type dopants (e.g. Mg or Zn) which are disadvantageous due to the possibility for thermal diffusion during growth with the further possibilities for erratic transport behavior and accumulation at heterointerfaces between epitaxially-grown semiconductor layers.

According to the present invention, wafer rotation may be used to provide a plurality of individual semiconductor lasers 10 or a semiconductor laser array having substantially identical lasing wavelengths for each visible laser; whereas epitaxial growth without wafer rotation may be preferred for forming a plurality of individual devices 10 or a laser array in which the lasing wavelengths vary from one semiconductor laser to adjacent lasers.

For forming a VCSEL device 10 according to the first embodiment of the invention as shown in the example of FIG. 1, a plurality of AlGaAs semiconductor layers (referred herein as the first-grown AlGaAs layers) are epitaxially grown above the substrate 12 for forming and defining a first DBR mirror 14 having a plurality of mirror periods. (The second DBR mirror 18 is subsequently formed by the growth of another plurality of AlGaAs semiconductor layers referred to herein as the last-grown AlGaAs layers.) Each mirror period is defined by a high-refractive-index first semiconductor layer 24 comprising Al$_x$Ga$_{1-x}$As and a low-refractive-index second semiconductor layer 26 comprising Al$_x$Ga$_{1-x}$As (with an aluminum composition, x, being larger in the second layer 26 than in the first layer 24). Each Al$_x$Ga$_{1-x}$As layer (24 and 26) has a thickness of substantially one-quarter-wavelength ($\lambda/4$) so that a reflection of light from each mirror period is additive. (The wavelength, $\lambda$, of light within semiconductor or dielectric layers as defined herein is related to the wavelength of light in free-space, $\lambda_0$, by $\lambda=\lambda_0/n$ where n is an index of refraction of the semiconductor or dielectric layers.)

For a VCSEL device 10 according to the first embodiment of the present invention, the DBR mirrors (14 and 18) are preferably made highly reflective. One of the mirrors preferably has a reflectivity of about 99% or more and most preferably about 99.8% or more; and the other mirror (i.e. an output coupling mirror) preferably has a slightly lower reflectivity (e.g. about 95–99%) to allow for coupling of a portion of the lasing light out from a resonant optical cavity 16 formed between the mirrors. In the example of FIG. 1, a visible VCSEL 10 for operation at a visible wavelength may have DBR mirrors formed from alternating layers of Al$_x$Ga$_{1-x}$As with adjacent layers having different values of the aluminum composition, x. For example, for operation at a wavelength, $\lambda_0$, in the range 670–690 nm, the DBR mirrors may each be comprised of alternating first layers 24 of Al$_{0.5}$Ga$_{0.5}$As and second layers 26 of AlAs.

In the example of FIG. 1, the first DBR mirror may comprise 55 ½ mirror periods and the second DBR mirror 18 may comprise 34 mirror periods and act as the output coupling mirror so that the lasing emission is directed upward from the device. For other embodiments of the present invention, the semiconductor alloy composition of the first and second layers may be selected to be different (e.g. a different composition of Al$_x$Ga$_{1-x}$As with x≧0.4 for the first layers 24) for lasing at a different preselected wavelength, $\lambda_0$; and the number of mirror periods of the first and second DBR mirrors may vary from the above example. Therefore, the invention should not be considered limited by the specific example of FIG. 1. The true scope of the invention is to be found in the claims.

The first DBR mirror 14 has a first conductivity type as determined by impurity doping of the first and second layers (24 and 26). In the case of a doped substrate 12, the conductivity type of the substrate and the first DBR mirror 14 are preferably the same. For example, for an n$^+$-doped GaAs substrate (e.g. with Si to about $10^{18}$ cm$^{-3}$), the first DBR mirror 14 may be doped n-type to about 2×$10^{18}$ cm$^{-3}$, for example, with the doping concentration preferably reduced slightly to 5–10×$10^{17}$ cm$^{-3}$ for several mirror periods nearest to the optical cavity 16 to reduce any absorption and impurity scattering losses therein.

The optical cavity 16 that is formed between the DBR mirrors (14 and 18) in some embodiments of the present invention (such as that shown in the example of FIG. 1) may also include one or more transition layers (e.g. first and second transition layers, 28 and 30, respectively) surrounding an active region 32 to reduce any band offsets between the active region and the DBR mirrors. The transition layers (28 and 30) are preferably formed of a semiconductor alloy such as AlAsP, AlGaAsP, or the like that is substantially free of indium. In the example of FIG. 1, the first transition layer 28 is formed above and adjacent to the first DBR mirror 14 by an epitaxial growth method (e.g. MOCVD), and is of the same conductivity type as the first DBR mirror and preferably doped with the same impurity dopant (e.g. n-type doped with Si to about 5×$10^{17}$ cm$^{-3}$) as the first DBR mirror. In the example of FIG. 1, the second transition layer 30 above the active region is of the opposite conductivity type (e.g. p-type doped with C to about 5×$10^{17}$ cm$^{-3}$), thereby forming a p-n or p-i-n junction within the optical cavity 16 and about the active region 32.

The optical cavity 16 has a thickness that is substantially equal to an integer multiple of one-half wavelength ($\lambda/2$) of the emitted light. Thus, when one or more transition layers are present (i.e. on one or both sides of the active region 32) as shown in the example of FIG. 1, the transition layers (e.g. 28 and 30 in FIG. 1) preferably have an thickness that performs, at least in part, an optical phase matching function by filling out the remainder of the multiple of $\lambda/2$ thickness of the optical cavity 16 (with each transition layer preferably having at most an thickness of $\lambda/2$ or less of the emitted light). When the thickness of the active region 32 is substantially equal to an integer multiple of $\lambda/2$, then the transition layers (if present) may have a total thickness that is substantially equal to an integer multiple of $\lambda/2$ (although in some embodiments of the present invention, the transition layers may be much thinner and included within an integer multiple of $\lambda/2$ optical cavity).

Figure 2:
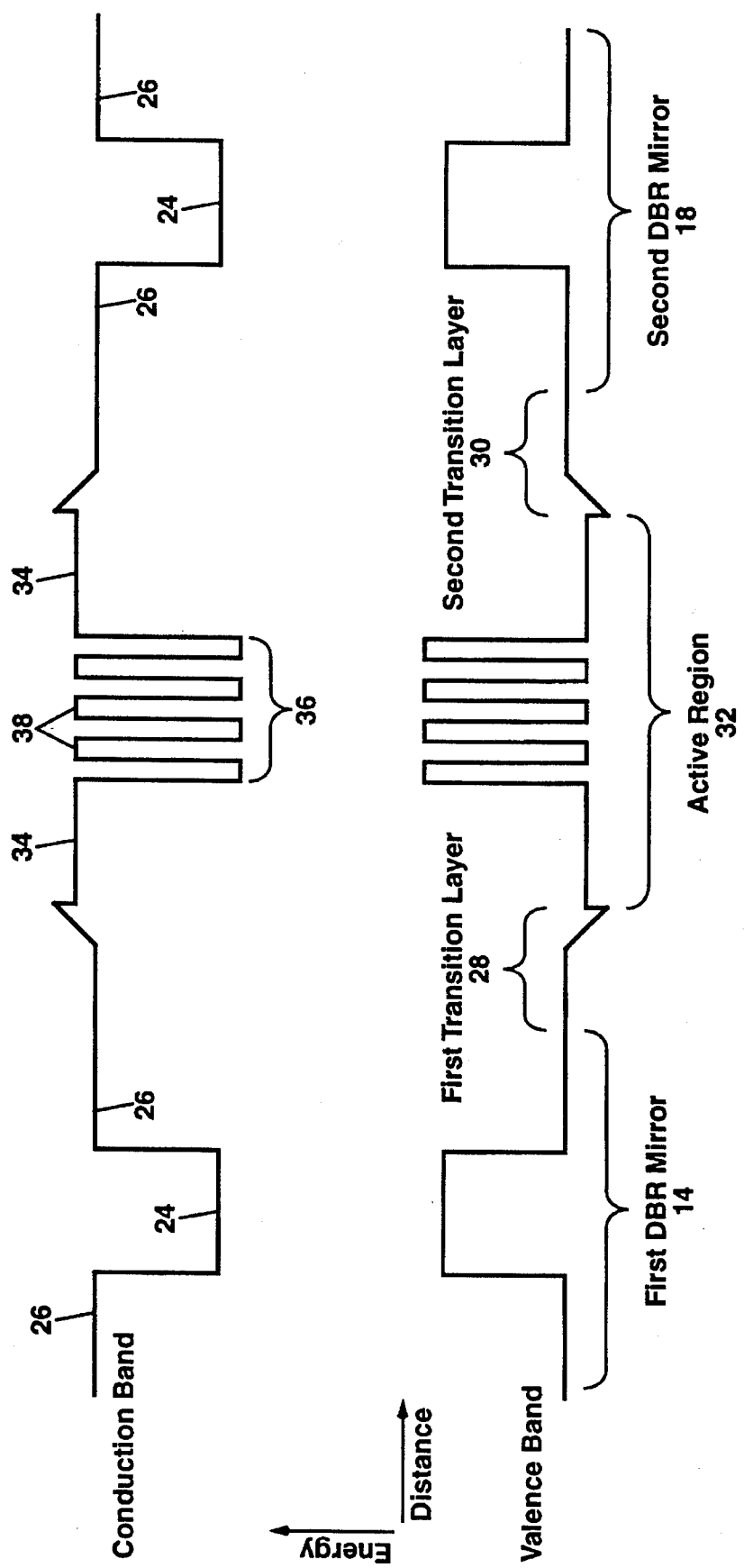
FIG. 2 shows a partial charge-neutral schematic energy band diagram of the visible VCSEL according to the present invention.
Figure 3:
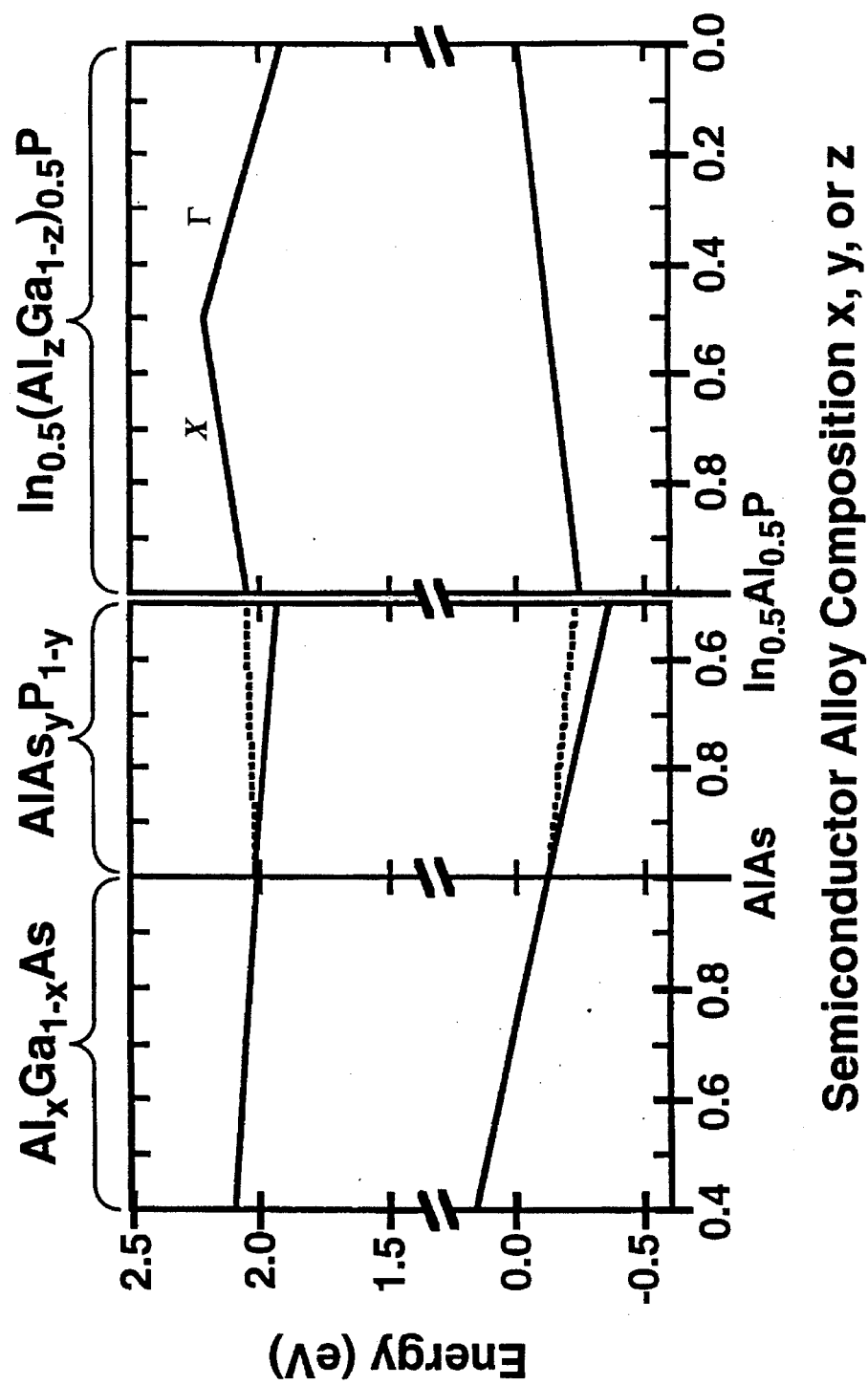
FIG. 3 shows a schematic energy band diagram showing the variation of the conduction band and valence band energies with semiconductor alloy composition for $Al_xGa_{1-x}As$, $AlAs_yP_{1-y}$ and $In_{0.5}(Al_zGa_{1-z})_{0.5}P$.

The transition layers (28 and 30) may each include a portion thereof adjacent the active region 32 that has a graded semiconductor alloy composition for transitioning (i.e. grading an energy bandgap) between an energy bandgap of the AlGaAs DBR mirrors and the bandgap of an InAlGaP active region, thereby reducing the size of any band offsets in the conduction and valence bands of the device as shown in FIGS. 2 and 3 and reducing carrier leakage from the active region. (For embodiments of the visible semiconductor laser 10 as an edge-emitting laser, the transition layers may be included to reduce the size of band offsets between an InAlGaP active region and $Al_xGa_{1-x}As$ confinement layers.)

The use of transition layers in a visible semiconductor laser 10 may be advantageous for forming efficient devices that operate in a continuous-wave (cw) mode since the energy bandgap of InAlGaP cladding layers 34 (about 2.3 eV) surrounding an active layer 36 in the active region may be larger than the bandgaps of $Al_xGa_{1-x}As$ alloys used for forming the DBR mirrors or confinement layers [for example, $E_g$ (AlAs)$\approx$2.17 eV, and $E_g$ ($Al_{0.5}Ga_{0.5}As$)$\approx$2.04 eV].

Without the transition layers (28 and 30) efficient carrier injection into the active region of the semiconductor lasers 10 may be impeded by the band offsets near the active region 32; and carrier confinement within the active region may be reduced by carder leakage therefrom. The use of transition layers having at least a portion thereof with an energy bandgap slightly larger than the bandgap of the InAlGaP cladding layers as shown in FIG. 2 may significantly improve carrier confinement by reducing carrier leakage from the active region 32.

In VCSEL embodiments of the present invention, substantially indium-free transition layers comprising AlAsP, AlGaAsP, or the like may also provide improved heat sinking over prior-art indium-containing spacer layers for removing heat generated within the active region 32. The improved heat sinking in VCSELs formed according to the present invention is due in part to the higher thermal conductivity of the substantially indium-free transition layers, and in part to a small thickness of the transition layers (28 and 30) which places the high-thermal-conductivity AlAs/$Al_xGa_{1-x}As$ DBR mirrors (14 and 18) in closer proximity to the active region 32.

The use of transition layers may also be advantageous for EEL devices formed according to a second embodiment of the present invention since the transition layers allow the use of high-thermal-conductivity $Al_xGa_{1-x}As$ confinement layers (i.e. having a thermal conductivity higher than indium-containing layers), and the placement of the confinement layers in close proximity to the active region for removing heat therefrom.

As an example, $AlAs_yP_{1-y}$ transition layers (28 and 30) may be formed with a composition-graded portion of $AlAs_yP_{1-y}$ (y graded from 1 to about 0.5) with the y=0.5 endpoint being nearest the active region 32, and the remainder of the transition layers being comprised of AlAs (i.e. y=1). The form of composition grading may be linear, step-wise linear, parabolic, or any other form of composition grading as known to the art. For a uniform doping of the transition layers, the composition grading is preferably parabolic to reduce tensile strain in the composition-graded portion.

A thickness of the composition-graded portion of $AlAs_yP_{1-y}$ transition layers is preferably limited to about 10 nm since this thickness is effective in reducing carrier leakage (primarily electron tunneling) from the active region 32; and for a thickness up to about 10 nm, the tensile strain in the graded $AlAs_yP_{1-y}$ portion may be accommodated without relaxation. The AlAs portion of each transition layer for forming a VCSEL according to the first embodiment of the present invention is preferably of a thickness sufficient to fill out the remainder of the thickness of the transition layers which should have a total thickness that is an integer multiple of $\lambda/2$. In other VCSEL embodiments of the present invention, it may be possible to form an optical cavity with a total thickness of $\lambda/2$ by forming the transition layers entirely of the composition-graded portion with a thickness of about 10 nm. $(Al_xGa_{1-x})As_yP_{1-y}$ transition layers may be formed in a manner similar to the $AlAs_yP_{1-y}$ transition layers of the above example. (For EEL devices formed according to the second embodiment of the present invention, the total thickness of the transition layer is not limited to preferably being an integer multiple of $\lambda/2$ thick. Instead, the thickness of each transition layer may be of any suitable thickness of up to about 100 nm, with any composition-graded portion thereof that is strained preferably having a thickness of $\leq 10$ nm.)

The schematic energy band diagrams in FIG. 3 show that $AlAs_yP_{1-y}$ transition layers may provide a nearly continuous grading of band offsets between an InAlGaP active region 32 and surrounding $Al_xGa_{1-x}As$ semiconductor layers. In FIG. 3, the solid lines correspond to the direct bandgaps of the X transitions, except for a $\Gamma$ transition in $In_{0.5}(Al_zGa_{1-z})_{0.5}P$ for $z \geq 0.5$; and the dashed lines correspond to the indirect bandgaps of $AlAs_yP_{1-y}$. (The conduction and valence band energies of $AlAs_yP_{1-y}$ for $0.5 \leq y \leq 1.0$ are according to the best known information). It should be noted that an energy band diagram for $(Al_xGa_{1-x})As_yP_{1-y}$ transition layers would be very similar to that shown in FIG. 3 for $AlAs_yP_{1-y}$ transition layers.

FIG. 3 shows that $AlAs_yP_{1-y}$ provides a larger (indirect) bandgap than AlAs; and for y$\approx$0.5 the indirect bandgap of $AlAs_yP_{1-y}$ is nearly equal to $In_{0.5}Al_{0.5}P$, the alloy having the largest bandgap of all the $In0.5(Al_zGa_{1-z})_{0.5}P$ alloys. Thus, the use of AlAsP transition layers may be advantageous according to the present invention for grading band offsets between the InAlGaP active region and surrounding $Al_xGa_{1-x}As$ ($x \geq 0.4$) semiconductor layers so that any barriers to hole and electron injection are reduced.

It should be noted that the energy band structure of AlAsP is not presently well known, and has received very little attention. However, the best known data indicates that the AlAsPAlAs heterojunction interface within each transition layer of the present example is type I, with at least 50% of the total band offset being in the valence band and thus providing an advantage for hole injection into the active region.

A further advantage of forming the transition layers from a substantially indium-free semiconductor alloy (e.g AlAsP, AlGaAsP, or any other alloy containing both As and P) is that the semiconductor alloy in the transition layers (28 and 30) may be graded in a substantially continuous manner by varying the As and P concentrations without the need for any abrupt switch-on of As and P growth sources. This avoids many of the growth difficulties of the prior art which for some semiconductor laser structures required an abrupt switch-on of As and P sources at a high growth temperature (about 750°–775° C.) with the possibility for affecting interfaces at the sides of the active region and reducing the carrier injection efficiency (especially for holes).

Finally, since the transition layers (28 and 30) according to the present invention are substantially free of indium, one of these layers may be doped p-type with carbon to a relatively high concentration (up to $10^{18}$ cm$^{-3}$ or higher) to enhance hole transport into the active region 32; and the other transition layer may be n-type doped to about the same concentration. According to the example of the first embodiment of the present invention in FIG. 1, the transition layers are located at the edges of the optical cavity 16 corresponding to a node of the lasing within the cavity so that the effect of any optical loss due to free-carrier absorption in the heavily-doped transition layers is reduced.

The DBR mirrors for the example of the first embodiment of the present invention in FIG. 1 are formed of $Al_xGa_{1-x}As$ ($x \geq 0.4$) with AlAs low-refractive-index second semiconductor layers 26 in contact with the $AlAs_yP_{1-y}$ transition layers (28 and 30). By composition grading the $AlAs_yP_{1-y}$ transition layers from $y=1$ adjacent the DBR mirrors to about $y=0.5$ adjacent the $In_{0.5}(Al_zGa_{1-z})_{0.5}P$ active region 32, any band offsets in the conduction and valence bands may be reduced, thereby improving device efficiency and lasing output power. In the case of an active region 32 comprising $In_{0.5}(Al_{0.5}Ga_{0.5})_{0.5}P$ cladding layers 34, the slightly higher energy bandgap of the composition-graded portion of the AlAsP transition layers may form small energy barriers of up to a few kT (as shown in the portion of the charge-neutral real-space energy band diagram of FIG. 2 centered about the active region 32) to improve carrier confinement within the active region and reduce carrier leakage therefrom.

The active region 32 preferably comprises an active layer 36 of InAlGaP surrounded by cladding layers 34 of InAlGaP having an energy bandgap higher than the active layer 36. The active layer 36 may comprise either a bulk semiconductor layer or one or more quantum-well layers. (A quantum-well layer is defined herein as a semiconductor layer providing a quantum confinement of electrons and holes therein by means of a quantum well, or one or more quantum wires or quantum dots.) The cladding layers 34 may be either of a uniform semiconductor alloy composition for forming a separate confinement heterostructure (SCH) active region 32; or the cladding layers may be composition-graded to form a graded-index separate-confinement heterostructure (GRIN-SCH) active region.

An InAlGaP active region 32 with a semiconductor alloy composition for the various components thereof given by $In_y(Al_zGa_{1-z})_{1-y}P$ where $0 \leq y \leq 1$ and $0 \leq z \leq 1$ may provide for semiconductor lasers 10 that operate at wavelengths in the range of about 550–720 nm from the green to deep red range of the visible spectrum. Thus, the scope of the present invention should not be limited to a specific wavelength.

The use of a multiple quantum-well active layer 36 may be preferred to increase the gain for lasing in the visible semiconductor laser 10 (both in VCSELs and in EELs). In this case, barrier layers 38 having an InAlGaP composition about the same or less than that of the cladding layers 34 may be used to separate the multiple quantum-well layers as shown in FIG. 2. In the example of FIG. 1, a visible VCSEL operating in the wavelength range 670–690 nm at room temperature may comprise four or five 6-nm-thick compressively-strained $In_{0.56}Ga_{0.44}P$ quantum-well layers separated by 6-nm-thick substantially lattice-matched $In_{0.5}(Al_{0.5}Ga_{0.5})_{0.5}P$ barrier layers 38 and sandwiched between 30–40 nm thick $In_{0.5}(Al_{0.5}Ga_{0.5})_{0.5}P$ cladding layers 34 to form a $\lambda/2$ active region 32 in an optical cavity 16 having a total thickness of $1\lambda$. For operation at other visible wavelengths, the various components of the active region (e.g. the cladding layers 34; the active layer 36 in the form of a bulk semiconductor layer or one or more quantum-well layers; and, if present, the barrier layers 38 between each pair of adjacent quantum-well layers) may comprise InAlGaP compounds with a semiconductor alloy composition given by $In_y(Al_zGa_{1-z})_{1-y}P$ where $0 \leq y \leq 1$ and $0 \leq z \leq 1$.

Since carbon is ineffective in doping InAlGaP semiconductor alloys due to the high temperatures ($\geq 750°$ C.) required for growth of the InAlGaP alloys by MOCVD and the very weak nature of the In-C bonding, any doping of the active region of necessity must be limited to Mg or Zn which is disadvantageous due to the possibility for thermal diffusion. Therefore, according to the present invention, for formation of a semiconductor laser having carbon as the sole p-type impurity dopant as is preferred, the active region 32 is preferably undoped (i.e. not intentionally doped). Nevertheless, undoped MOCVD-grown $In_y(Al_zGa_{1-z})_{1-y}P$ may have a residual background n-type doping of about $10^{16}$–$10^{17}$ cm$^{-3}$ for $z \geq 0.3$; and the background doping concentration increases with the aluminum concentration, $z$. Therefore, in some embodiments of the present invention, it may be desirable to lightly dope the active region 32 with Mg or Zn (up to about $5 \times 10^{17}$ cm$^{-3}$) to overcome the background doping and to aid in defining the placement of a semiconductor junction.

In the example of the first embodiment of the present invention in FIG. 1, the second DBR mirror 18 is formed above and adjacent to the top side of the active region 32. For an upward-emitting VCSEL 10, the second DBR mirror is partially transmissive. The first few (up to about 10) mirror periods of the second DBR mirror 18 above the active region are preferably grown by MOCVD with high-refractive-index first layers 24 and low-refractive-index second layers 26 similar in $Al_xGa_{1-x}As$ composition to the first DBR mirror 14 but with an opposite conductivity type (e.g. p-type doping with carbon when the first DBR mirror 14 is n-type doped). The remaining mirror periods of the second DBR mirror 18 may be epitaxially grown and doped in a similar manner to form an all-semiconductor VCSEL 10; or the remaining mirror periods may comprise deposited alternating high- and low-refractive-index dielectric layers of $TiO_2/SiO_2$, $ZrO_2/SiO_2$, $Nb_2O_5/SiO_2$, $ZnSe/CaF_2$, or the like for forming a hybrid VCSEL.

In other VCSEL embodiments of the present invention, a selective oxidation process as described hereinafter may be used to convert the low-refractive-index layers 26 (e.g. AlAs) of one or both of the DBR mirrors entirely to an oxide of aluminum to increase the reflectivity of each mirror period (by providing a larger change in refractive index, $\Delta n$, between the layers 24 and 26). In these embodiments of the invention, multiple etch steps may be used to etch downward to contact each side of the active region 32 (or each transition layer), with current blocking achieved by an etch or ion-implantation process as described hereinafter. For these VCSEL embodiments of the present invention, the current flow bypasses the second DBR mirror 18 and may even bypass the first DBR mirror 14 if a lower contact 22 is provided directly to the first transition layer 28.

The doping levels in the second DBR mirror 18 in FIG. 1 are similar to those of the first DBR mirror 14 (about $5-10 \times 10^{17}$ cm$^{-3}$ for a few mirror periods nearest the active region and about $2 \times 10^{18}$ cm$^{-3}$ for the majority of the remaining mirror periods); except that the second DBR mirror has a conductivity type opposite that of the first DBR mirror. Additionally, the last grown mirror period of the second DBR mirror may have an increased doping concentration (to about $10^{19}$ cm$^{-3}$ or more) to facilitate electrical contacting of the second DBR mirror. A thin (e.g. 10 nm) GaAs cap layer 40 having a high doping of about $10^{19}$ cm$^{-3}$ or more may be grown above the second DBR mirror 18 as shown in FIG. 1 to further aid in forming an electrical contact to the device 10, and to prevent oxidation of the underlying AlGaAs. (A similar GaAs cap layer may be provided above the second confinement layer 52 for the EEL device according to the second embodiment of the present invention.)

To reduce an electrical series resistance and voltage drop in the visible VCSEL 10 of FIG. 1, one or both of the DBR mirrors may be grown with a graded semiconductor alloy composition between each high-refractive-index layer 24 and each low-refractive-index layer 26. The composition grading is preferably parabolic although other types of composition grading (e.g. linear or step-wise linear grading) as known to the art may be used. As an example, graded DBR mirrors (14 and 16) may be formed with each high-refractive-index layer 24 being comprised of a 0.15λ Al$_{0.5}$Ga$_{0.5}$As central region and each low-refractive-index layer 26 being comprised of a 0.15λ AlAs central region with the Al$_{0.5}$Ga$_{0.5}$As and AlAs central regions being separated by a 0.1λ composition-graded region comprised of Al$_x$Ga$_{1-x}$As with the aluminum composition, x, being continuously graded between the endpoint compositions (e.g. AlAs and Al$_{0.5}$Ga$_{0.5}$As).

Figure 5:
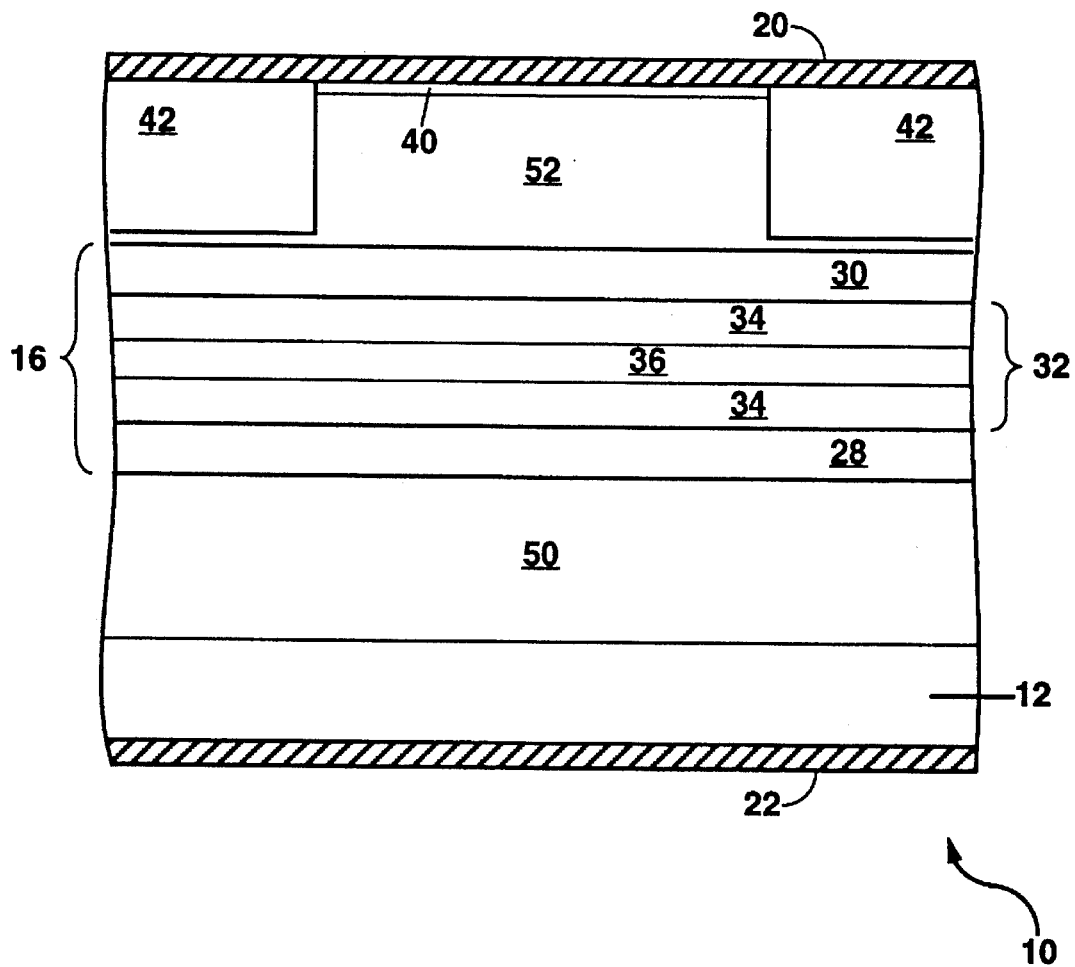
FIG. 5 shows a schematic diagram of an example of a visible EEL according to the second embodiment of the present invention.

In the example of the first embodiment of the present invention in FIG. 1, the upper electrode 20 is preferably deposited after patterning the last-grown AlGaAs layers (or layer for an EEL device) in the semiconductor laser structure and forming an annular current-blocking region 42 thereabout. The current-blocking region 42 may be formed, for example, by etching down at least part way through the last-grown AlGaAs layers (or layer for an EEL device) and forming a mesa-like structure as shown in FIGS. 1 and 5. For a VCSEL, the mesa-like structure may comprise a central portion of the second DBR mirror (e.g. with a diameter of about 8–40 μm) along an optical axis of the cavity that is left after the etch process as is shown in the example of FIG. 1. For an EEL device, the mesa-like structure preferably comprises a stripe-shaped portion of the second confinement layer as shown in the example of FIG. 5. (In other embodiments of the present invention, the mesa-like structure may extend downward into or through the active region 32.)

For forming the mesa-like structure, a dry etch method using a plasma (e.g. reactive ion etching, reactive ion beam etching, electron-cyclotron resonance etching, or the like) is preferred since a dry etch process provides a high anisotropy and may produce substantially vertical sidewalls for the mesa-like structure. One or more Al$_x$Ga$_{1-x}$As layers (e.g. in the second DBR mirror or the second confinement layer) are preferably etched with a BCl$_3$/Cl$_2$ plasma which is effective in removing any oxidation that may have formed on the aluminum-containing layers and thereby provides an increased etch rate. For etching down into the active region comprising InAlGaP, the addition of CH$_4$ and H$_2$ to the plasma may be advantageous for increasing the etch rate for the semiconductor layers containing indium.

After forming the mesa-like structure by etching, an insulating or high resistivity layer such as a polyimide, a regrown semiconductor layer (e.g. having a doping type opposite that of the etched Al$_x$Ga$_{1-x}$As), or the like may be grown, deposited or spun onto the semiconductor wafer to fill in the etched region for at least in part planarizing the upper electrode 20, and for protecting and/or passivating the etched regions of the semiconductor laser.

Another method for forming the current-blocking region 42 is by implanting high-energy ions such as hydrogen or oxygen ions in a region outside a portion (e.g. a portion of the second DBR mirror that is about 5–50 μm diameter, or a portion of the second confinement layer that is stripe-shaped and about 5–100 μm wide) of the last-grown AlGaAs layer(s) to increase an electrical resistivity in the implanted region. Ion implantation may remove the need to etch down into the layers of the semiconductor laser, and may improve heat sinking of the device through the last-grown AlGaAs layers. The energy of the implanted ions may be preselected so that the region of implanted ions extends downward into or through the last-grown AlGaAs layers, and the implanted ions may even extend into the active region 32.

As yet another example, the current-blocking region 42 in a VCSEL device may comprise one or more layers of the second DBR mirror that have been altered by a chemical oxidation process to increase the electrical resistivity therein by converting one or more of the low-refractive-index layers 26 of the second DBR mirror 18, at least in part, to an oxide of aluminum. This oxidation process may be performed by etching downward at least partially through the second DBR mirror 18 to expose one or more of the low-refractive-index layers 26, and then exposing the layers 26 to a moist environment (e.g. a flow of nitrogen gas bubbled through water at about 85° C. to entrain moisture therein) with the semiconductor wafer maintained at an elevated temperature of about 350°–500° C. for a time sufficient for an annular portion of the layers 26 outside a central region of the second DBR mirror to be converted to an oxide of aluminum.

The oxidation rate (i.e. an inward lateral extent of the oxidation process which converts aluminum in one or more of the low-refractive-index layers 26 to an oxide of aluminum) may be selectively controlled and reduced by adding a slight amount of Ga (up to about 20%) to one or more of the layers 26 during epitaxial growth to form Al$_x$Ga$_{1-x}$As layers with an aluminum composition, x, greater than that of the high-refractive-index layers 24. (The inward extent of oxidation decreases nonlinearly with the amount of Ga added to the layers 26, and thus the high-refractive-index layers 24 of Al$_x$Ga$_{1-x}$As with a smaller value of x are oxidized to a much smaller extent, if at all.) The addition of Ga reduces the lateral extent of the oxidation process, and may be preferred for a majority of the layers 26 of one or both of the DBR mirrors that are located furtherest from the active region 32. In this manner, a current aperture may be formed in one or more of the layers 26 close to the active region for effectively channeling an electrical current into the active region to improve an efficiency of the VCSEL device 10. An oxidized current-blocking region 42 may further improve device efficiency and performance by index guiding of the light within the optical cavity.

The above examples for forming a current-blocking region 42 may be used either singly or in combination for forming the visible semiconductor laser 10 according to the present invention.

In FIGS. 1 and 5, upper and lower electrodes (20 and 22, respectively) are provided above and below the semiconductor junction for electrically activating the visible semiconductor laser by means of an electrical forward-bias current. The lower electrode 22 is normally located on the bottom of the substrate 12 and may be of a thickness that is substantially opaque to light; and the upper electrode 20 is located at a level somewhere above the active region 32. For a VCSEL device as shown in the example of FIG. 1, the upper electrode 20 may be a pad located above the second DBR mirror 18 and patterned to provide a central opening 44 for light transmission, with the opening 44 being circular, elliptical, square, rectangular, or otherwise shaped. Alternately, the upper electrode 20 for a VCSEL may be a semi-transparent metallization (for example, indium-tin-oxide) covering the second DBR mirror. For VCSEL embodiments of the present invention in which the light is to be transmitted downward, a transparent semiconductor substrate 12 (e.g. AlAs, AlGaAs or the like) may be used or otherwise a channel opening may be etched upward through the substrate and terminating near the first DBR mirror 14. In these VCSEL embodiments of the invention, the lower electrode 22 may be a semi-transparent or patterned metallization; and the upper electrode 20 may be an opaque metallization.

The upper electrode 20 in FIGS. 1 and 5 may be deposited before or after formation of the current-blocking region 42. If the upper electrode 20 is deposited before the formation of the current-blocking region 42 by an etching, ion implantation or selective oxidation step, the upper electrode may either be protected by an overlying deposited and patterned mask layer; or the upper electrode may form at least a part of the mask layer.

In the example of the first embodiment of the present invention in FIG. 1, the upper electrode 20 may be formed, for example, by depositing a AuBe/Ti/Au metallization with a thickness of about 150 nm or more above a p-type second DBR mirror 18, and defining the central opening (e.g. with a diameter of about 5–30 μm) therein by a lithographic masking and lift-off process. Likewise, in FIG. 1, the lower electrode 22 may be formed, for example, by depositing a AuGe/Ni/Au patterned or full-surface metallization on the lower surface of an n-type substrate 12. (If the doping types of the substrate and second DBR mirror are reversed in the above example, the above compositions of the electrode metallizations would also be reversed.) After deposition, the metallizations are annealed, forming electrical contacts to the semiconductor laser.

The central opening 44 in a patterned upper electrode 20 is generally sized to be about the same or smaller in diameter than the central portion of the second DBR mirror 18 so that light may be coupled into or out from the visible VCSEL 10 through the central opening while allowing an operating voltage (i.e. a bias voltage) to be applied across the upper and lower electrodes (20 and 22, respectively) for biasing the active region 32 of the device 10. The central opening 44 (and the current-blocking region 42) may be further sized to control and affect a lateral mode order of the lasing in the optical cavity to provide either for lasing in a fundamental lateral mode order (i.e. TEM$_{00}$) or for lasing in multiple lateral modes.

Semiconductor lasers 10 according to the present invention may be formed either singly or in the form of a one- or two-dimensional array. Both individual lasers and arrays are formed by defining the devices photolithographically with electrical current isolation for each laser provided by the current-blocking region 42. (Additional electrical isolation may be provided by a deep etch or implant through the active region outside the device.) The lasing wavelengths of a plurality of individual lasers or adjacent lasers in an array may be substantially identical or different as determined during epitaxial growth of the laser structure. Rotating the wafer 12 during growth may produce lasers having lasing wavelengths that are substantially identical; whereas holding the wafer stationary during growth may produce adjacent lasers having lasing wavelengths that differ slightly.

For operation, the semiconductor lasers 10 may be mounted on a heat sink with the substrate 12, for example, positioned in contact with the heat sink and attached thereto. By forward-biasing the semiconductor junction in the active region 32 visible light and lasing may be generated therein.

Figure 4:
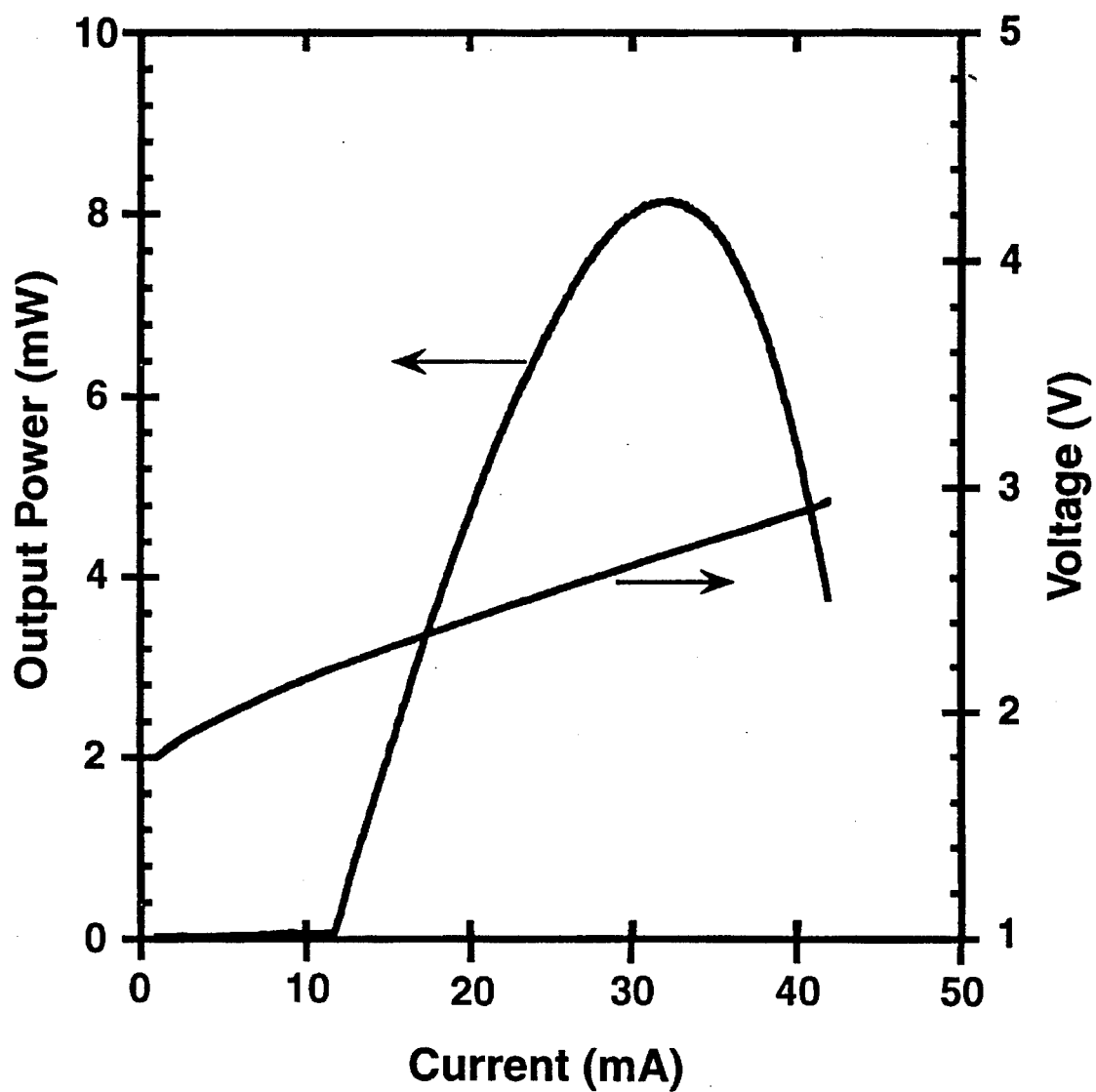
FIG. 4 shows light (optical power) versus current and voltage versus current characteristic curves for continuous-wave operation of a visible VCSEL according to the present invention.

FIG. 4. shows light (optical power) versus current and voltage versus current characteristic curves for continuous-wave operation of a visible VCSEL according to the first embodiment of the present invention. The VCSEL 10 in FIG. 4 has five $In_{0.56}Ga_{0.44}P$ quantum-well layers, and is formed with a proton-implanted current-blocking region. The device in FIG. 4, with a 30-μm-diameter current-blocking region, has a threshold current of 11.7 mA at a heat-sink temperature of 20° C., and provides up to 8.2 mW of multi-mode cw output power. A peak electrical-to-optical power conversion efficiency for the device in FIG. 4 is 11%. The operating voltage of the device is about 2.2 volts at threshold, only about 0.4 volts above the bandgap energy at the lasing wavelength of 687 nm.

Other visible VCSEL devices were fabricated according to the present invention with a four-quantum-well structure, and ion-implantation defined current-blocking regions of 5–50 μm diameter. Of these visible VCSEL devices, those having a 10-μm-diameter or smaller current-blocking region operated in the fundamental lateral mode (TEM$_{00}$), at least over a substantial portion of the operating current range. For 10μm-diameter VCSEL devices, the measured peak fundamental-mode cw output power was about 1.9 mW, with multi-lateral mode operation obtained at power levels up to about 2.7 mW cw. The threshold current for the 10-μm-diameter VCSEL devices was about 2.3 mA; and the peak power conversion efficiency was about 10%.

By designing the VCSELs with a gain peak that is initially blue-shifted with respect to a resonance of the optical cavity, the heating within a VCSEL may be used to shift the lasing wavelength into resonance with the cavity, thereby providing a VCSEL having a threshold current that depends to a smaller extent on the operating temperature and an increased power conversion efficiency. For visible VCSELs having a 20-μm-diameter current-blocking region, the lasing wavelength of about 690 nm was shifted into resonance with the cavity at a heat-sink temperature of 30° C. so that over an operating temperature range of 20°–50° C., the threshold current for cw lasing only varied by less than 10% (from 4.4 mA to 4.8 mA). In other visible VCSELs with a 15-μm-diameter current-blocking region, the peak cw output power was measured to be about 1.5 mW at 50° C. and 0.8 mW at 60° C., decreasing with temperature at a rate of about −0.075 mW/°C. from the 3.8 mW peak cw output power at a heat-sink temperature of 20° C.

The improved performance of visible VCSELs fabricated according to the present invention is due, at least in part, to a reduced tree-carrier absorption loss provided by the use of an undoped InAlGaP active region, to an increased electrical and thermal conductivity within the device by the use of AlGaAs DBR mirrors having parabolic composition grading and the placement of the mirrors in closer proximity to the active region, and to the use of carbon as the sole p-type dopant for providing a more precise and stable doping profile in the VCSEL structure. Additionally, the improved performance of the visible VCSELs is due, at least in part, to the use of transition layers to reduce band offsets between the InAlGaP active region and AlGaAs DBR mirrors, thereby reducing an operating voltage and improving the performance of the device.

FIG. 5 shows an example of a visible edge-emitting laser 10 formed according to a second embodiment of the present invention. In the example of FIG. 5, an edge-emitting laser (EEL) 10 may be formed with a first-grown AlGaAs semiconductor layer being a first confinement layer 50, and the last-grown AlGaAs semiconductor layer being a second confinement layer 52 (e.g. by substituting first and second $Al_xGa_{1-x}As$ confinement layers for the first and second $Al_xGa_{1-x}As$ DBR mirrors during epitaxial growth of the semiconductor wafer). The confinement layers are each about 0.8–1.0 μm thick with an aluminum concentration, x, being about 0.4 or larger, and preferably in the range $0.8 \leq x \leq 1$.

The EEL device 10 in the example of FIG. 5 has an active region 32 as described heretofore with an active layer 36 comprising a bulk semiconductor layer or at least one quantum-well layer. EEL devices having an active region comprising a multiple quantum-well active layer 36 may include barrier layers of a substantially lattice-matched InAlGaP alloy [e.g. $In_{0.5}(Al_{0.5}Ga_{0.5})_{0.5}P$] between each pair of adjacent quantum-well layers. The active region 32 is terminated on either side by InAlGaP cladding layers 34 having a thickness, for example, of about 90–100 nm and formed of an alloy composition such as $In_{0.5}(Al_{0.5}Ga_{0.5})_{0.5}P$ which is substantially lattice-matched to GaAs.

The active region may be separated from the confinement layers on one or both sides by a transition layer to reduce band offsets between the InAlGaP active region and the AlGaAs confinement layers. The transition layers (28 and 30) may be comprised of a substantially indium-free semiconductor alloy (e.g AlAsP, AlGaAsP, or another alloy containing both As and P) to allow continuous composition grading without the need for any abrupt switch-on of As and P sources as described herebefore. The transition layers (28 and 30) may be comprised of a graded portion adjacent the active region and an $Al_xGa_{1-x}As$ portion adjacent the AlGaAs confinement layer with an aluminum composition, x, of each transition layer being substantially matched to the aluminum composition of the adjacent confinement layer. (In some embodiments of the present invention, an EEL device may be formed with only a single p-type doped transition layer for improving hole transport into the active region of the device.)

During epitaxial growth of a visible EEL device 10 according to the second embodiment of the present invention, carbon is used as the sole p-type dopant for one of the confinement layers (and also an adjacent transition layer for embodiments of the invention employing one or more transition layers).

Stripe-geometry EEL lasers may be formed by forming rectangular current-blocking regions 42 on either side of a stripe-shaped portion of the second confinement layer 52 and overlying GaAs cap layer 40 which are substantially unaltered by the etching or ion implantation step used for forming the current-blocking regions.

The upper electrode 20 may be deposited and patterned to at least cover the unaltered stripe-shaped portion of the device to allow current flow into the active region (with the upper electrode possibly forming at least a part of a mask layer used for forming the current-blocking regions). The lower electrode 22 may be formed as a patterned or full-surface electrode. The electrodes in the example of FIG. 5 may comprise AuBe/Ti/Au and AuGe/Ni/Au metallizations as described heretofore.

Fabry-Perot cavity stripe-geometry EEL lasers 10 may be formed by etching or cleaving through the active region 32 to form end-facet mirrors substantially perpendicular to the stripe-shaped portion, with the end-facet mirrors preferably being separated by about 500 to 1000 μm or more. Reflective coatings may be applied to one or both end-facet mirrors to increase the reflectivity thereof (or anti-reflection coatings to reduce the reflectivity of one of the end-facet mirrors). The completed EEL lasers may be attached to a heat sink for operation thereof by applying a forward-bias current across the semiconductor junction formed about the active region by the n- and p-type doped confinement layers (and transition layers, if present).

For visible edge-emitting lasers 10 fabricated according to the present invention, advantages similar to those described heretofore for VCSEL devices apply. Namely, carbon may be used exclusively as the p-type dopant for providing a more precise and stable dopant profile for visible EEL devices; any abrupt switch-on of As and P sources during epitaxial growth may be avoided; heat removal from the active region may be increased by providing high-thermal-conductivity $Al_xGa_{1-x}As$ confinement layers surrounding the active region; and transition layers may be provided to reduce band offsets between the InAlGaP active region and the $Al_xGa_{1-x}As$ confinement layers and to improve carrier injection into the device and reduce an operating voltage of the device for more efficient operation thereof.

The matter set forth in the foregoing description and accompanying drawings is offered by way of illustration only and not as a limitation. Other applications and variations of the visible VCSEL will become evident to those skilled in the art. The actual scope of the invention is intended to be defined in the following claims when viewed in their proper perspective based on the prior art.

What is claimed is:

1. A semiconductor laser for emitting light at a visible wavelength comprising:

(a) a compound semiconductor substrate;

(b) at least one first-grown AlGaAs semiconductor layer formed above the substrate and having a first conductivity type;

(c) an active region comprised of InAlGaP formed above the first-grown AlGaAs layer;

(d) at least one last-grown AlGaAs semiconductor layer formed above the active region and having a second conductivity type opposite the first conductivity type, one of the conductivity types being defined as p-type by carbon, and the other conductivity type being defined as n-type to form a semiconductor junction about the active region;

(e) electrodes above and below the semiconductor junction for electrically activating the laser.

2. The laser of claim 1 wherein the substrate is of the first conductivity type.

3. The laser of claim 1 wherein the n-type conductivity is defined by an impurity dopant selected from the group consisting of Si, Sn, Se, Te, and S.

4. The laser of claim 1 wherein the AlGaAs layers are defined by an $Al_xGa_{1-x}As$ semiconductor alloy composition with an aluminum composition, x, in the alloy defined by $x \geq 0.4$.

5. The laser of claim 1 wherein the active region includes at least one quantum-well layer.

6. The laser of claim 5 wherein the quantum-well layer is a strained quantum-well layer.

7. The laser of claim 6 wherein each strained quantum-well layer is comprised of InGaP.

8. The laser of claim 1 wherein the active region includes at least two quantum-well layers, and further includes a substantially lattice-matched InAlGaP barrier layer between each pair of adjacent quantum-well layers.

9. The laser of claim 1 wherein various components of the active region comprise InAlGaP compounds as defined by $In_y(Al_zGa_{1-z})_{1-y}P$ where $0 \leq y \leq 1$ and $0 \leq z \leq 1$.

10. The laser of claim 1 further including a current-blocking region.

11. A plurality of lasers according to claim 10 in the form of an array.

12. The laser of claim 1 further including at least one transition layer comprised of a substantially indium-free semiconductor alloy located adjacent to the active region.

13. The laser of claim 12 in which the substantially indium-free semiconductor alloy is selected from the group consisting of AlAsP and AlGaAsP.

14. The laser of claim 12 wherein each transition layer includes a portion thereof adjacent the active region that has a graded semiconductor alloy composition.

15. The laser of claim 1 in the form of a vertical-cavity surface-emitting laser (VCSEL) and having a first distributed Bragg reflector (DBR) mirror defined by a plurality of the first-grown AlGaAs semiconductor layers and a second distributed Bragg reflector (DBR) mirror defined by a plurality of the last-grown AlGaAs semiconductor layers, adjacent AlGaAs layers in each DBR mirror having different semiconductor alloy compositions.

16. The VCSEL of claim 15 wherein the active region has a thickness that is substantially equal to an integer multiple of one-half wavelength ($\lambda/2$) of the emitted light.

17. The VCSEL of claim 15 having an optical cavity defined by the DBR mirrors with a thickness that is substantially equal to an integer multiple of one-half wavelength ($\lambda/2$) of the emitted light.

18. The laser of claim 1 in the form of an edge-emitting laser (EEL) with the first- and last-grown AlGaAs layers being confinement layers.

19. A vertical-cavity surface-emitting laser for emitting light at a visible wavelength comprising:
   (a) a compound semiconductor substrate;
   (b) a first AlGaAs distributed Bragg reflector (DBR) mirror being of a first conductivity type formed above the substrate;
   (c) an active region comprised of InAlGaP formed above the first DBR mirror;
   (d) a second AlGaAs distributed Bragg reflector (DBR) mirror of the opposite conductivity type formed above the active region and being of a second conductivity type opposite the first conductivity type, one of the conductivity types being defined as p-type by carbon, and the other conductivity type being defined as n-type to form a semiconductor junction about the active region; and
   (e) electrodes above and below the semiconductor junction for electrically activating the laser.

20. The laser of claim 19 wherein the substrate is of the first conductivity type.

21. The laser of claim 19 wherein the opposite conductivity type is n-type as defined by an impurity dopant selected from the group consisting of Si, Sn, Se, Te, and S.

22. The laser of claim 19 wherein the AlGaAs DBR mirrors are defined by a plurality of $Al_xGa_{1-x}As$ semiconductor layers with an aluminum composition, x, defined by $x \geq 0.4$, and adjacent $Al_xGa_{1-x}As$ semiconductor layers having a different aluminum composition, x.

23. The laser of claim 19 wherein at least one of the DBR mirrors, defined by a plurality of alternating high-refractive-index and low-refractive-index semiconductor layers, includes a composition-graded region between each high-refractive-index and low-refractive-index semiconductor layer.

24. The laser of claim 23 wherein the high-refractive-index layers are comprised of $Al_xGa_{1-x}As$, and the low-refractive-index layers are comprised of AlAs.

25. The laser of claim 24 wherein the aluminum composition, x, is defined by $0.4 \leq x \leq 1$.

26. The laser of claim 19 wherein the active region includes at least one quantum-well layer.

27. The laser of claim 26 wherein each quantum-well layer is a strained quantum-well layer.

28. The laser of claim 27 wherein each strained quantum-well layer is comprised of InGaP.

29. The laser of claim 19 wherein the active region includes at least two quantum-well layers, and further includes a substantially lattice-matched InAlGaP barrier layer between each pair of adjacent quantum-well layers.

30. The laser of claim 19 wherein various components of the active region comprise InAlGaP compounds.

31. The laser of claim 30 wherein the composition of the InAlGaP compounds is defined as $In_y(Al_zGa_{1-z})_{1-y}P$ where $0 \leq y \leq 1$ and $0 \leq z \leq 1$.

32. The laser of claim 19 further including a current-blocking region.

33. A plurality of lasers according to claim 32 in the form of an array.

34. The laser of claim 19 further including at least one transition layer comprised of a substantially indium-free semiconductor alloy located adjacent to the active region.

35. The laser of claim 34 wherein a total thickness of the transition layers is substantially equal to an integer multiple of one-half wavelength ($\lambda/2$) of the emitted light.

36. The laser of claim 34 in which the substantially indium-free semiconductor alloy is selected from the group consisting of AlAsP and AlGaAsP.

37. The laser of claim 34 wherein each transition layer includes a portion thereof adjacent the active region that has a graded semiconductor alloy composition.

38. The laser of claim 19 wherein the thickness of the active region is substantially equal to an integer multiple of one-half wavelength ($\lambda/2$) of the emitted light.

39. The laser of claim 19 having an optical cavity defined by the DBR mirrors with a thickness that is substantially equal to a multiple of one-half wavelength ($\lambda/2$) of the emitted light.

40. The laser of claim 19 wherein the second DBR mirror comprises a lower portion formed of a plurality of alternating low-refractive-index and high-refractive-index semiconductor layers and an upper portion thereof formed of a plurality of alternating low-refractive-index and high-refractive-index dielectric layers.

41. An edge-emitting semiconductor laser for emitting light at a visible wavelength comprising:
   (a) a compound semiconductor substrate;
   (b) a first AlGaAs confinement layer formed above the substrate and having a first conductivity type;
   (c) an active region comprised of InAlGaP formed above the first confinement layer;

(d) a second AlGaAs confinement layer formed above the active region and having a second conductivity type opposite the first conductivity type, one of the conductivity types being defined as p-type by carbon, and the other conductivity type being defined as n-type to form a semiconductor junction about the active region;

(e) electrodes above and below the semiconductor junction for electrically activating the laser.

42. The laser of claim 41 wherein the substrate is of the first conductivity type.

43. The laser of claim 41 wherein the n-type conductivity is defined by an impurity dopant selected from the group consisting of Si, Sn, Se, Te, and S.

44. The laser of claim 41 wherein the AlGaAs confinement layers are defined by an $Al_xGa_{1-x}As$ semiconductor alloy with an aluminum composition, x, in the alloy defined by $x \geq 0.4$.

45. The laser of claim 41 wherein the active region includes at least one quantum-well layer.

46. The laser of claim 45 wherein each quantum-well layer is a strained quantum-well layer.

47. The laser of claim 46 wherein each strained quantum-well layer is comprised of InGaP.

48. The laser of claim 41 wherein the active region includes at least two quantum-well layers, and further includes a substantially lattice-matched InAlGaP barrier layer between each pair of adjacent quantum-well layers.

49. The laser of claim 41 wherein various components of the active region comprise InAlGaP compounds as defined by $In_y(Al_zGa_{1-z})_{1-y}P$ where $0 \leq y \leq 1$ and $0 \leq z \leq 1$.

50. The laser of claim 41 further including a current-blocking region.

51. A plurality of lasers according to claim 50 in the form of an array.

52. The laser of claim 41 further including at least one transition layer comprised of a substantially indium-free semiconductor alloy located adjacent to the active region.

53. The laser of claim 52 in which the substantially indium-free semiconductor alloy is selected from the group consisting of AlAsP and AlGaAsP.

54. The laser of claim 52 wherein each transition layer includes a portion thereof adjacent the active region that has a graded semiconductor alloy composition.

* * * * *